United States Patent
Hsia et al.

(10) Patent No.: US 6,372,520 B1
(45) Date of Patent: *Apr. 16, 2002

(54) SONIC ASSISTED STRENGTHENING OF GATE OXIDES

(75) Inventors: Kang-Jay Hsia; George H. Maggard, both of Colorado Springs; David W. Daniel, Divide, all of CO (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,594

(22) Filed: Jul. 10, 1998

(51) Int. Cl.$^7$ ............................................. H01L 21/00
(52) U.S. Cl. ........................... 438/4; 438/308; 438/378; 438/795
(58) Field of Search ..................... 438/4, 48, 308, 438/378, 510, 787, 795

(56) References Cited

U.S. PATENT DOCUMENTS

| | | | |
|---|---|---|---|
| 4,018,626 A | * 4/1977 | Schwuttke et al. | |
| 4,341,574 A | 7/1982 | Landes | 456/64 |
| 4,380,864 A | * 4/1983 | Das | |
| 4,837,185 A | 6/1989 | Yau et al. | 427/42 |
| 4,981,538 A | 1/1991 | Kikuchi | 156/73.1 |
| 5,017,508 A | 5/1991 | Dodt et al. | 437/173 |
| 5,219,790 A | * 6/1993 | Miyatake | |
| 5,225,355 A | 7/1993 | Sugino et al. | 437/10 |
| 5,279,973 A | 1/1994 | Suizu | 437/25 |
| 5,296,412 A | 3/1994 | Ohsawa | 437/247 |
| 5,314,846 A | 5/1994 | Boitnott | 437/238 |
| 5,531,861 A | 7/1996 | Yu et al. | 156/636.1 |
| 5,538,923 A | 7/1996 | Gardner et al. | 437/238 |
| 5,624,865 A | 4/1997 | Schuegraf et al. | 438/396 |
| 5,648,128 A | * 7/1997 | Yeh et al. | 427/601 |
| 5,997,659 A | * 12/1999 | Lisiansky et al. | 148/33 |
| 6,001,715 A | * 12/1999 | Manka et al. | 438/535 |

OTHER PUBLICATIONS

"Sonic Assisted Strengthening of SLS Glass "; by Wang Hsien, William C. LaCourse and Paul E. Johnson. ( This is a personal Copy from Dr. William C. Lacourse) New York State College of Ceramics at Alfred University.

"Plasma Damage and Photo–Annealing Effect of Thin Gate Oxides and Oxynitrides During O2 Plasma Exposure" IEEE Electron Device Letteres, vol. 17, No. 3, Mar. 1996–Author(s)–kafai Lai et al.

* cited by examiner

Primary Examiner—Trung Dang
(74) Attorney, Agent, or Firm—Carstens, Yee & Cahoon, LLP

(57) ABSTRACT

A method and apparatus for repairing and improving the endurance characteristics of process damaged oxide film formed in a semiconductor device involving sonic annealing by vibrating or oscillating a wafer at a predetermined frequency, wave amplitude, and duration. A signal from a frequency generator is amplified by a voltage amplifier and then sent to a speaker or other acoustic device for the production of vibrating acoustical wave energy. This acoustical wave energy is then directed at a submicron device wafer during a specified time period in order to anneal the gate oxide and, thereby, improve the characteristics of the oxide film.

20 Claims, 2 Drawing Sheets

SONIC ASSISTED STRENGTHENING OF GATE OXIDES

BACKGROUND OF THE INVENTION

1. Technical Field

The present invention relates to a method and apparatus for repairing and improving the endurance characteristics of process damaged oxide film formed in a semiconductor device and, more particularly, to sonic annealing by vibrating or oscillating a wafer at a predetermined frequency, wave amplitude, and exposure duration to bring about annealing of the gate oxide.

2. Description of Related Art

An unfortunate consequence of many different process methods for the fabrication of certain submicron devices, including the dry etching process, ion implantation process, and the plasma chemical vapor deposition (CVD) process, is the resulting damage of the thin gate oxide film of the device. This damage impacts the yield and reliability of complementary metal-oxide semiconductor (CMOS) transistors. By way of example, the ion implantation process refers to a mechanism of doping a semiconductor by means of ion implantation. The dopant atoms first are ionized so that each has a positive charge. Through the use of electric and magnetic fields the ions are focused into a well defined beam and accelerated to very high energies in a vacuum. The beam is then scanned into the surface of the wafer. This ion implantation method causes radiation damage to the substrate. This damage degrades carrier mobility and lifetime if not restored.

The silicon industry standard method for addressing the problem of such process induced damage is a high-temperature anneal after gate oxide growth within a single furnace cycle. This thermal annealing provides sufficient thermal energy to promote rearrangement of the atoms in oxide layer and, thus, repair of the damaged layer. A temperature range of 450° to 1,000° C. and heating cycle of about thirty minutes is typical for the high-temperature annealing process. These temperature ranges, however, are problematic for many submicron devices, such as a metal oxide semiconductor field effect transistor (MOSFET) device having a gate oxide thickness scaled below 100 Å. The allowable thermal budget for these submicron devices becomes a constraint in light of the potential to otherwise permanently damage the device. As a result, annealing temperatures are typically reduced and only part of the damage caused by the initial process can be repaired by annealing. In addition, after forming an aluminum wiring film on the device, damage inflicted by the passivating process can not be subjected to high-temperature annealing due to aluminum's low melting point. Since the damage that remains in these instances in the gate oxide is not ignorable in view of the reliability requirements of submicron MOSFET devices, a more effective method for treating the initial wafer processing induced damage, without the potential collateral affects of high-temperature annealing, is needed.

SUMMARY OF THE INVENTION

A method and apparatus for annealing oxide film is shown in which a wafer is vibrated or oscillated at a predetermined frequency and amplitude for a predetermined time period in order to anneal the gate oxide. This annealing process may be accomplished with a sonic wave device frequency generator in direct contact with the wafer, or a sonic wave anneal through a medium, such as air or a specific gas. In addition, the sonic wave anneal process could take place in situ during the oxide growing process with or without the contact described above. The oscillation frequency and amplitude, preferred medium, exposure time length, and medium temperature and pressure of the process can vary depending on the physical properties of the treated wafer and desired anneal. However, the method is preferred in lower temperature ranges in order to avoid the problems induced by typical high-temperature annealing.

Accordingly, it is a feature of the present invention to provide a method of repairing the damage induced by wafer processing within environmental parameters, particularly lower temperatures, that will not expose the device to the potentially damaging side effects that result from high temperature annealing. Another feature of the invention is to provide an alternative annealing process to the present industry standard high temperature annealing process. This alternative annealing process involves sonic annealing of the wafer by way of vibrating or oscillating the wafer at a predetermined frequency, amplitude, and time period in order to bring about an effective and efficient annealing of the gate oxide. The sonic annealing process of this invention may be utilized in a broad application of the manufacturing of semiconductor devices to improve the quality of, among other materials, BPSG and thin metal films.

The above as well as additional features and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION

Figure 1:
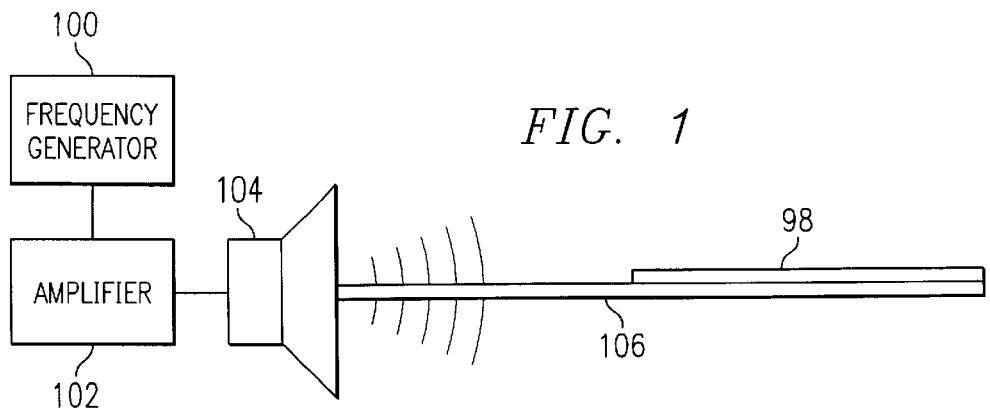
FIG. 1 illustrates a sonic wave anneal with physical contact between the sonic wave generating device and the wafer.

A direct contact embodiment of the invention is illustrated by FIG. 1. Referring to FIG. 1, a frequency generating device 100, for example an HP-33120A model frequency generator manufactured by Hewlett-Packard Co., delivers an electrical signal corresponding to a specific sonic frequency to a voltage amplifier 102, for example a Bogen C100 model amplifier distributed by Alled Electronics in Fort Worth, Tex. The amplifier 102 then amplifies this electrical signal to correspond to a given frequency amplitude. The amplified electrical signal is then transmitted to a speaker 104, piezoelectric transducer, or other device capable of the acoustic production of sonic waves/energy. In the embodiment demonstrated by FIG. 1, the speaker 104 is in direct physical contact with a wafer holder 106, for example a thin aluminum plate. The wafer holder 106 securely holds, and is in planar contact with, the wafer 98 to be treated by the invention's sonic annealing process. Thus, the annealing vibration is physically transmitted through the wafer holder 106 to the wafer 98, and the wafer 98 is in physical contact with the device that generates the sonic energy, the speaker 104.

The specific process parameters of the invention in this and every embodiment disclosed in this application are dependent on the characteristics of the wafer 98, including the wafer thickness, material properties, and the thickness of the gate oxide layer. The sonic frequency, wave amplitude, exposure duration, and process pressure and temperature can all be adjusted by experiment to arrive at the combination of these parameters that best improves the desired characteristics of the gate oxide. For example, for typical NMOS (10 um/0.4 um) transistors treated after the metal IV process stage, the frequency, wave amplitude, treatment duration, and process temperature and pressure can be adjusted until the optimum improvement in the treated device's hot-carrier life time has been observed by using the direct contact embodiment illustrated by FIG. 1. The use of hot-carrier life time as a target reliability response is particularly useful for such NMOS transistors since conventional annealing processes typically fail to fully compensate for the short hot-carrier life time found after the metal IV process which has developed because of back end process induced interface damages in the s/d region. Other target reliability indicators, such as time dependent dielectric breakdown (TDDB), can also be used to establish the invention's optimum process parameters in order to address particular wafer processing issues.

Figure 2:
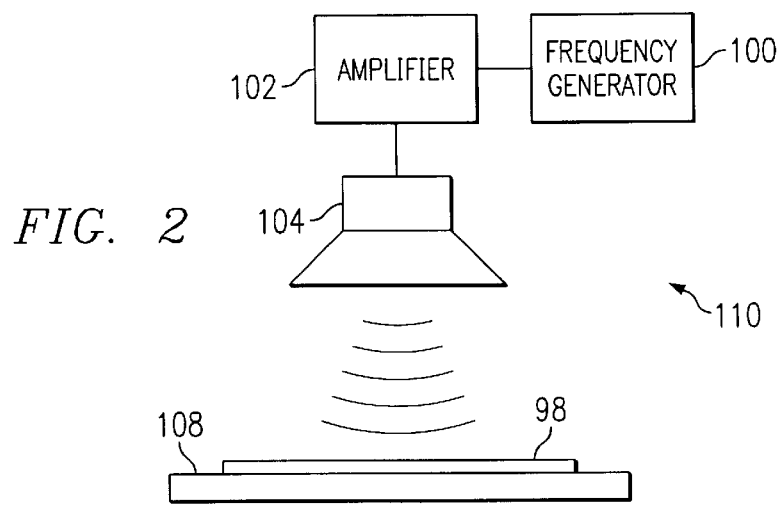
FIG. 2 illustrates a sonic wave anneal without contact between the sonic wave generating device and the wafer.

FIG. 2 shows an embodiment of the invention whereby a sonic anneal occurs without physical contact between the speaker 104 and the wafer 98. The frequency generator 100 and voltage amplifier 102 provide an electrical signal to a speaker 104 or other acoustical device which broadcasts the sonic waves through a gaseous medium 110, such as ambient air, onto the receiving wafer 98. The wafer 98 rests unattached on a wafer holder 108 in order to allow the wafer 98 to resonate with as little dampening as possible from the holder 108. The specific process parameters are obtained through experimentation and are dependent on the wafer characteristics, gate oxide characteristics, and the desired reliability indicator. For typical NMOS (10 um/0.4 um) transistors treated after the metal IV process stage, the frequency, wave amplitude, treatment duration, and process temperature and pressure can be adjusted until the optimum improvement in the treated device's hot-carrier life time has been observed by using the embodiment illustrated by FIG. 2.

Figure 3:
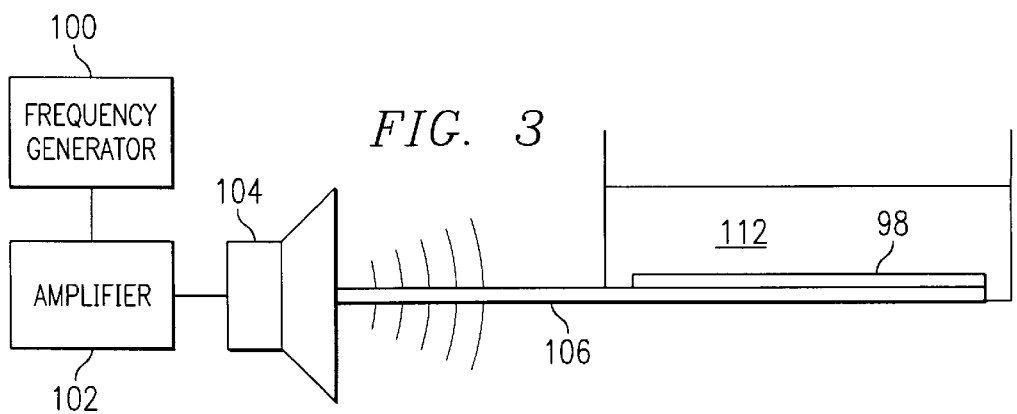
FIG. 3 illustrates a sonic wave anneal utilizing a sonic wave generating device in contact with the wafer while the wafer is in a liquid medium.

FIG. 3 shows an embodiment of the invention using the direct contact approach shown in FIG. 1 and further using a liquid medium 112. As with the previously detailed direct contact method, the frequency generating device 100 and voltage amplifier 102 send an electrical signal to the speaker 104, which is in direct contact with the wafer holder 106. The resonance produced is transmitted through the wafer holder 106 into a container holding a liquid medium, such as 3M Fluorinert FC-77 distributed by 3M's Industrial Chemical Products Division in St. Paul, Minn., and finally to the treated wafer 98. The specific process parameters are obtained through experimentation and are dependent on the wafer characteristics, gate oxide characteristics, and the desired reliability indicator. For typical NMOS (10 um/0.4 um) transistors treated after the metal IV process stage, the frequency, wave amplitude, treatment duration, process temperature, and pressure can be adjusted until the optimum improvement in the treated device's hot-carrier life time has been observed by using the embodiment illustrated by FIG. 3.

Figure 4:
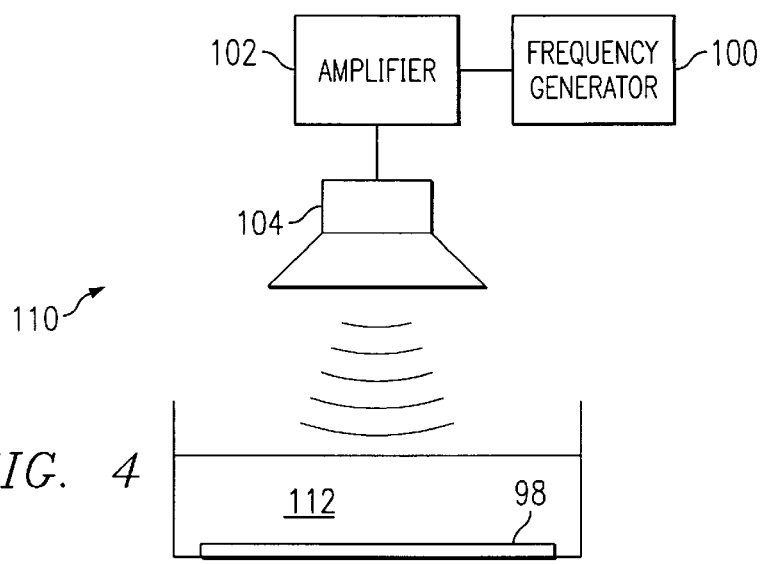
FIG. 4 illustrates a sonic wave anneal without contact between the sonic wave generating device and the wafer while the wafer is in a liquid medium.

FIG. 4 shows an embodiment of the invention whereby the sonic waves are transmitted acoustically through a liquid medium 112. The frequency generator 100 and amplifier 102 combine with a speaker 104 to produce an acoustic sonic vibration directed at the wafer 98 while submerged in a liquid medium 112. FIG. 4 shows the speaker transmitting the acoustic wave through both a gaseous medium 110, such as ambient air, and a liquid medium 112, such as 3M Fluorinert FC-77. However, the embodiment contemplates direct emersion of the speaker 104 in the liquid medium 112 as well. The sonic waves travel through the liquid medium until contacting the target wafer 98, thus causing the wafer 98 to resonate within the liquid medium 112. The specific process parameters are obtained through experimentation and are dependent on the wafer characteristics, gate oxide characteristics, and the desired reliability indicator. For typical NMOS (10 um/0.4 um) transistors treated after the metal IV process stage, the frequency, wave amplitude, treatment duration, and process temperature and pressure can be adjusted until optimum improvement in the treated device's hot-carrier life time has been observed by using the embodiment illustrated by FIG. 4.

Figure 5:
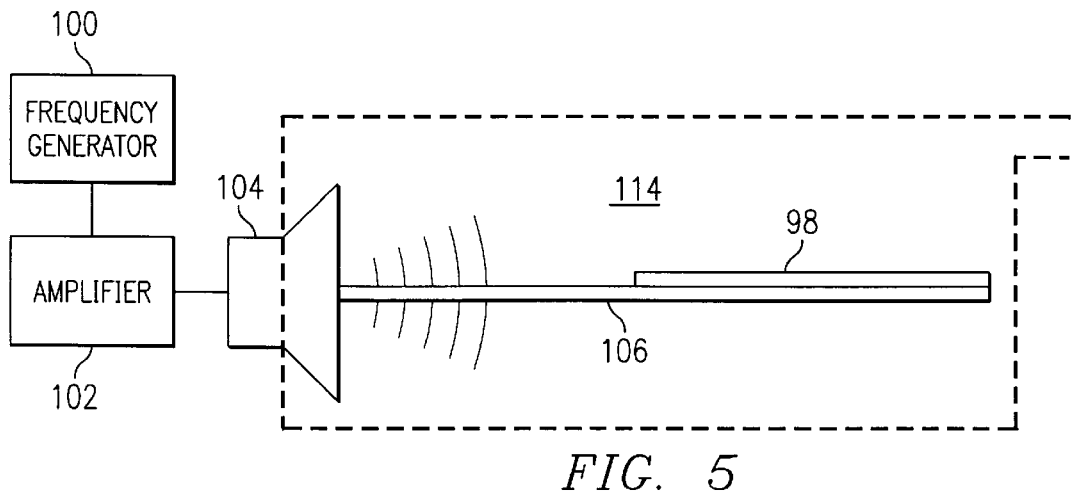
FIG. 5 illustrates a sonic wave anneal in situ during oxide growth process with the sonic wave generating device in contact with the wafer.

FIG. 5 shows an embodiment of the invention involving an in situ annealing during the oxide growing process. As with the embodiment illustrated in FIG. 1, the in situ process shown by FIG. 5 involves a frequency generator 100, an amplifier 102, a speaker 104, and a wafer holder 106 for the transmission of the sonic vibration to the wafer 98. The in situ embodiment adds the step of conducting the sonic annealing while the wafer is undergoing the oxide growth process withing an oxidation furnace 114. The temperature and pressure parameters during this process in the oxidation furnace are typically one atmospheres and 900° degrees C. The in situ sonic annealing, therefore, is accomplished in this environment. The in situ annealing has the added benefit of requiring one less processing step, by eliminating a separate annealing step.

Figure 6:
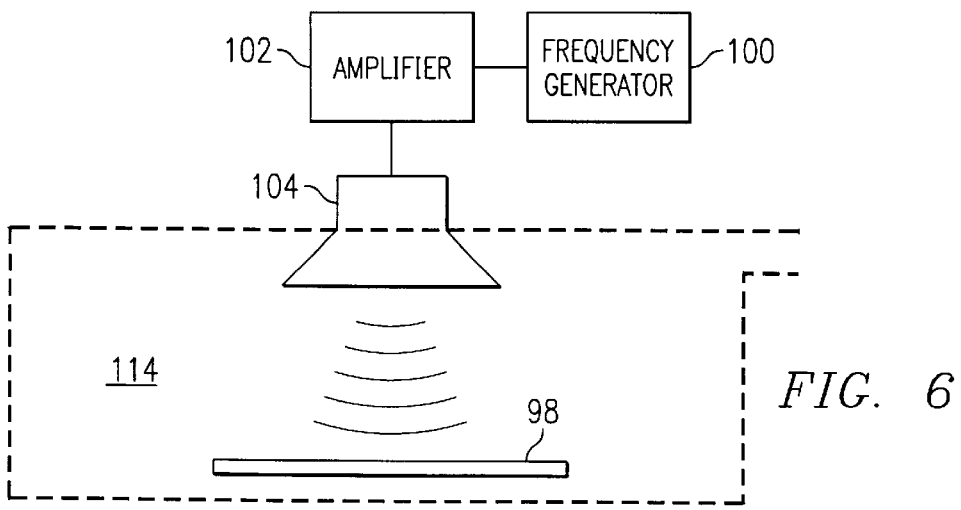
FIG. 6 illustrates a sonic wave anneal in situ during oxide growing process without contact between the sonic wave generating device and the wafer.

FIG. 6 shows an in situ annealing embodiment with the acoustic waves directed onto the wafer through the oxidation furnace gaseous medium. Again, the frequency generator 100, amplifier 102, and speaker 104 are used to generate an acoustic vibration directed at the wafer 98. The acoustic waves, however, travel through a gaseous medium used in the oxide growing process, for example $O_2$, and the annealing occurs at the temperature and pressure ranges associated with the oxide growing process. Again, the specific process parameters for both of the in situ methods described are obtained through experimentation and are dependent on the wafer characteristics, gate oxide characteristics, and the desired reliability indicator. For typical NMOS (10 um/0.4 um) transistors a frequency in the range of 1 kHz to 1 mHz and wave amplitude in the range of 1 to 100 volt peak to peak applied over a duration of 1 minute to 24 hours is recommended.

While the invention has been particularly shown and described with reference to the preferred embodiment disclosed herein, it will be understood by those skilled in the art that various changes in form and detail may be made therewith without departing from the spirit and scope of the invention.

What is claimed is:

1. A process for annealing submicron devices comprising the steps of:
   (a) generating sonic energy; and,
   (b) directing the sonic energy at a submicron device.

2. The process of claim 1 wherein the annealing steps take place in situ during an oxide growing process.

3. A process for annealing submicron devices comprising the steps of:
   (a) generating sonic energy; and,
   (b) directing the sonic energy at a submicron device wherein the submicron device is submerged in a liquid medium.

4. The process of claim 1 wherein the frequency of the sonic energy is in the range of 1 kHz to 1 mHz.

5. A process for annealing submicron devices comprising the steps of:
   (a) generating sonic energy; and,
   (b) directing the sonic energy at a submicron device wherein the wave of amplitude of the sonic energy is in the range of 1 to 100 volts peak to peak.

6. The process of claim 1 wherein step (b) is conducted over a duration of 1 minute to 24 hours.

7. A method for processing a semiconductor wafer containing submicron devices, wherein the semiconductor wafer has damage, the method comprising:
   directing sonic energy at the wafer containing submicron devices for a selected amount of time, wherein the sonic energy has an energy level and the selected period of time is sufficient to anneal the damage on the wafer.

8. A method for processing a semiconductor wafer, wherein the semiconductor wafer has damage, the method comprising:
   directing sonic energy at the wafer for a selected amount of time, wherein the sonic energy has an energy level and the selected period of time is sufficient to anneal the damage on the wafer wherein the directing step is performed by placing the wafer in physical contact with a device that generates the sonic energy.

9. A method for processing a semiconductor wafer, wherein the semiconductor wafer has damage, the method comprising:
   directing sonic energy at the wafer for a selected amount of time, wherein the sonic energy has an energy level and the selected period of time is sufficient to anneal the damage on the wafer further comprising:
   maintaining the temperature of the wafer at a temperature used to grow oxide.

10. A method for processing a semiconductor wafer, wherein the semiconductor wafer has damage, the method comprising:
    directing sonic energy at the wafer for a selected amount of time, wherein the sonic energy has an energy level and the selected period of time is sufficient to anneal the damage on the wafer, wherein the directed step is performed with the wafer in an oxidation furnace gaseous medium.

11. A method for processing a semiconductor wafer, wherein the semiconductor wafer has damage, the method comprising:
    directing sonic energy at the wafer for a selected amount of time, wherein the sonic energy has an energy level and the selected period of time is sufficient to anneal the damage on the wafer, wherein wafer is located in a liquid medium and the sonic energy is directed at the wafer through the liquid medium.

12. The method of claim 11, wherein sonic energy directed at the wafer is generated by a device located within the liquid medium.

13. A method for processing a wafer comprising the steps of:
    (a) thermally growing oxide on the wafer; and
    directing sonic energy at the wafer during the growing step.

14. A method for processing a wafer containing submicron devices where the wafer has damage, the method comprising:
    vibrating the wafer containing submicron devices at a frequency sufficient to anneal the damage.

15. A method for processing a wafer having damage, the method comprising:
    vibrating the wafer at a frequency sufficient to anneal the damage wherein the wafer is in physical contact with a device that generates the vibration.

16. The method of claim 14, wherein the wafer is vibrated by sonic energy.

17. A method for processing a wafer having damage, the method comprising:
    vibrating the wafer at a frequency sufficient to anneal the damage wherein the wafer is located in a liquid medium.

18. The method of claim 17, wherein the wafer is vibrated by sonic energy directed through the liquid medium.

19. A method for processing a wafer having damage, the method comprising:
    vibrating the wafer at a frequency sufficient to anneal the damage, wherein the wafer is located in an oxidation furnace.

20. The method of claim 19, wherein the anneal takes place during oxide growth.

* * * * *